United States Patent [19]
Fan Chiang et al.

[11] Patent Number: 5,442,278
[45] Date of Patent: Aug. 15, 1995

[54] APPARATUS FOR DETECTING THE FREQUENCY OF AN INPUT SIGNAL BY COUNTING PULSES DURING AN INPUT SIGNAL CYCLE

[75] Inventors: Yung F. Fan Chiang; Kun-M. Lee, both of Kweishan, Taiwan

[73] Assignee: Acer Peripherals, Inc., Taiwan

[21] Appl. No.: 126,329

[22] Filed: Sep. 24, 1993

[51] Int. Cl.⁶ ............................................. G01R 23/02
[52] U.S. Cl. ................ 324/76.41; 324/76.48; 377/39
[58] Field of Search ............... 324/76.39, 76.41, 76.48, 324/76.62, 76.55; 377/30, 31, 39; 340/658

[56] References Cited

U.S. PATENT DOCUMENTS

| | | | |
|---|---|---|---|
| 4,150,432 | 4/1979 | Sorden | 324/76.55 |
| 4,326,256 | 4/1982 | Furumoto | 377/39 |
| 4,471,299 | 9/1984 | Elmis | 324/76.41 |
| 4,707,653 | 11/1987 | Wagner | 324/76.41 |
| 4,984,254 | 1/1991 | Thomas | 324/76.41 |
| 5,089,770 | 2/1992 | Lee et al. | 324/76.55 |

*Primary Examiner*—Kenneth A. Wieder
*Assistant Examiner*—Christopher M. Tobin
*Attorney, Agent, or Firm*—Fish & Richardson

[57] ABSTRACT

An apparatus for detecting frequency of an input signal by counting the pulses of a reference signal of a predetermined frequency within one cycle of the input signal is disclosed. The apparatus includes a first and a second latch for latching the number of pulses of the reference signal for two consecutive periods of the input signal. In response to the reference signal, a comparator is used to compare the output value of the first and the second latch. When they are different, a flip-flop generates an interrupt signal to a microprocessor. The microprocessor reads the updated number of pulses and generates an updated frequency value based on the updated number of pulses and the predetermined frequency of the reference signal.

11 Claims, 2 Drawing Sheets

APPARATUS FOR DETECTING THE FREQUENCY OF AN INPUT SIGNAL BY COUNTING PULSES DURING AN INPUT SIGNAL CYCLE

BACKGROUND OF THE INVENTION

This invention relates to a frequency detection apparatus, and, in particular, relates to an apparatus for detecting the frequency of an input signal with the aid of a reference signal of a predetermined frequency.

Detecting the frequency of the input signals to the monitor control circuit of a multi-frequency monitor system is a basic requirement for operating the monitor system.

According to the conventional approach, there are two methods for detecting the frequency of the input signals to the multi-frequency monitor system.

The first method uses a frequency-voltage conversion circuit to convert the input signal to be detected into a direct current (DC) voltage. Then a plurality of comparators are utilized to compare the DC voltage with a plurality of preset reference voltages. Therefore, through the outputs of the plurality of comparators, the range of frequency of the input signal is determined. However, this method can only detect to which frequency range the input signal belongs. It is also time consuming to preset the plurality of reference voltages for the reference inputs of the plurality of comparators.

The second method uses a microprocessor to periodically access an output value of a counter, which is adapted to receive the input signal, and to calculate the frequency of the input signal periodically based on the output value. However, this method uses a substantial amount of processor time bringing about a low efficiency use of the microprocessor. This is specially true when the frequency of the input signal is not changed for a substantial period of time and the periodical calculation of the frequency by the microprocessor is not necessary at all for this period of time.

SUMMARY OF THE INVENTION

To the shortcomings of the conventional approach, the present invention provides a frequency detection apparatus which may detect the frequency of an input signal by utilizing a reference signal with a predetermined frequency.

The apparatus of the invention comprises a timing control circuit, a counter, a first latch and a microprocessor. The timing control circuit, in response to the input signal and a reference signal of a predetermined frequency, generates first second control signals. The counter has a clock input terminal for receiving the reference signal, and, in response to the second control signal, the counter is reset and begins to count. The counter has an output terminal for outputing a count value. The first latch has an input terminal for receiving the count value, and, in response to the first control signal, latches the count value and outputs a first counter value at an output terminal. The microprocessor receives the first counter value and outputs a value of the frequency of the input signal.

The invention may be further understood by the following derailed descriptions along with the appended drawings.

DETAILED DESCRIPTION OF THE INVENTION

Figure 1:
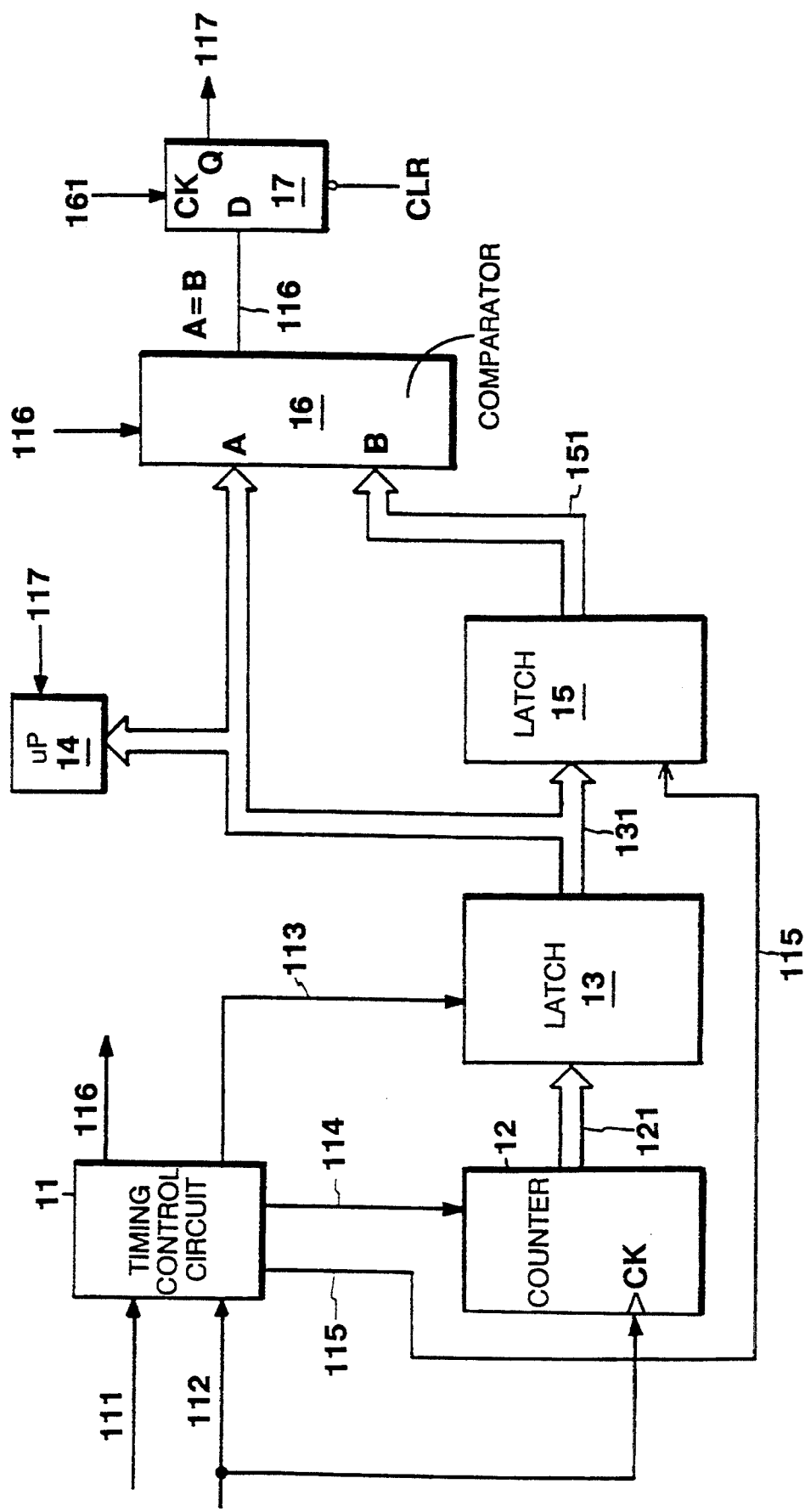
FIG. 1 shows basic circuit blocks of the invention.

Referring to FIG. 1, the present invention at least includes a timing control circuit 11, a counter 12, a first latch 13 and a microprocessor 14.

The timing control circuit 11 receives an input signal 111 whose frequency is unknown and to be determined, and receives a reference signal 112 whose frequency is predetermined and known. The timing control circuit 11, responsive to the input signal 111 and the reference signal 112, generates a first control signal 113 and a second control signal 114. The timing diagram of the signals mentioned is disclosed in FIG. 2, which will be further portrayed.

The counter 12 has a clock input terminal for receiving the reference signal 112. In response to the second control signal 114, the counter 12 resets and begins to count. The counter 12 has an output terminal for generating a counter value 121.

The first latch 13 has an input terminal for receiving the counter value 121. Responsive to the first control signal 113, the first latch 13 latches the counter value 121 and outputs a new count value 131 at an output terminal.

The microprocessor 14 receives the new count value 131 and calculates the frequency of the input signal 111 in accordance with a predetermined algorithm and outputs the value of frequency which is used by the control circuit of a multi-frequency monitor system.

The timing of the signals mentioned above is disclosed in FIG. 2 and described in the followings.

As the input signal 111 activates at the point a1, the first control signal 113 is activated and the counter value 121 is latched by the first latch 13 and appears as the new count value 131. As at least one complete cycle of the reference signal 112 is passed, at the point b1, the first control signal 113 is deactivated. The signal 115 is an inverted version of the first control signal 113 the function of which will be described later.

Figure 2:
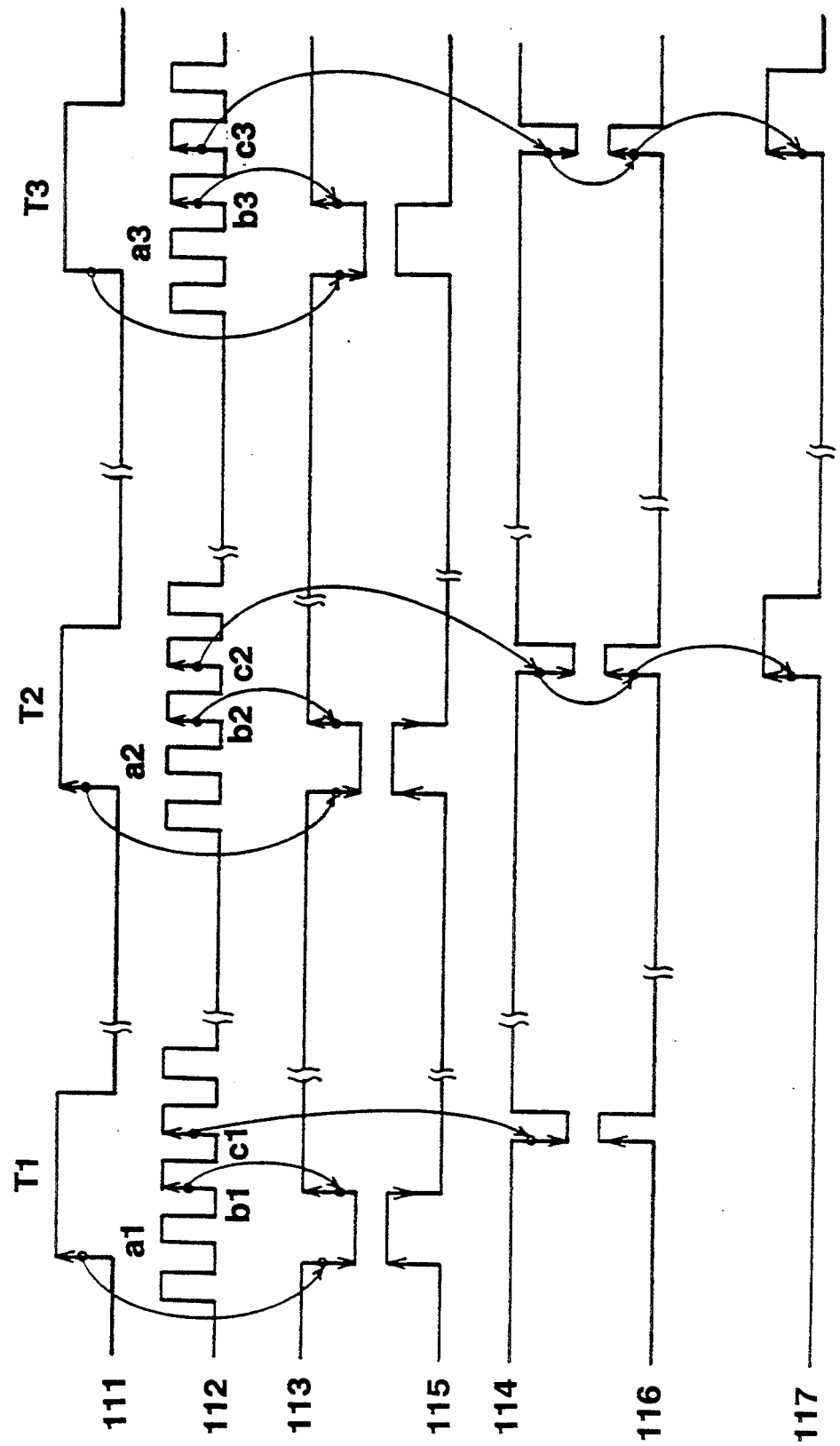
FIG. 2 shows the timing relationship of the signals of FIG. 1.

As at least one cycle of the reference signal 112 is further passed, at the point c1, the second control signal 114 is activated which resets the counter value 121 of the counter 12 to zero. The signal 114 may be deactivated as at least one half cycle of signal 112 is further passed, which is shown in FIG. 2.

After the counter 12 is reset under the control of the second control signal 114, the counter 12 begins to count in response to the reference signal 112 and outputs the count value signal 121. As the input signal 111 is activated again, that is the point a2, the first control signal 113 is thereby activated latching the counter value 121 of the counter 12 on the instant and outputs the same at signal line 131. The counter value appears on the signal line 131 is the number of pulses occurring from the points c1 to a2. Using this new count value 131, the microprocessor 14 calculates and obtains the updated frequency of the input signal 111.

For instance, suppose there are 100 pulses of the reference signal 112 occurring between points c1 and a2, and the frequency of the reference signal 112 is known to be 10 MHz (Mega Hertz). Then the frequency of the input signal 111 is approximately equal to 10 MHz divided by 100, that is 100 KHz. If accuracy is further required, the pulses occurring between point a1 to c1 should be included in the frequency calculation. As a example, suppose there are three pulses, then the frequency of the input signal 111 is substantially equal to 10 MHz divided by 103. This results a frequency of 97.1 KHz. It may easily be proved that the difference is only 3 percent when the pulses between points a1 and c1 are neglected.

Described above is only one embodiment of the invention.

The second embodiment of the invention, as shown still in FIG. 1, which includes the first embodiment, further comprises a second latch 15, a comparator 16 and a flip-flop 17.

The second latch 15 has an input terminal coupled to the output terminal of the first latch 13 through the new count value signal 131. Responsive to the control signal 115, the second latch 15 latches the new count value 131 and outputs an old count value 151 at an output terminal. The control signal 115, as shown in FIG. 2, is an inverted version of the first control signal 113. In other words, at every time point such as a1, a2 or a3, etc., the second latch 15 latches the new count value 131.

The comparator 16 has a first and second input terminals A, B accepting the new and old count value 131, 151 respectively. In response to a control signal 116 from the timing control circuit 11, the comparator 16 compares the new and old count value 131 and 151. If they are equal, the trigger signal 161 is not enabled. If they are not equal, the trigger signal 161 is enabled. As shown in FIG. 2, the control signal 116 is an inverted version of the second control signal 114.

It has to be understood that at the first cycle T1 of the signal 111 of FIG. 2, the new and old count value 131,151 are both zero. At the second cycle T2 of the signal 111, the old count value 151 is still zero and the new count value 131 has a value of 100 in our example described above. At the third cycle T3, the old count value 151 is 100 and the new count value 131 has a value equal to the number of pulses of the reference signal 112 occurring between the points c2 and a3.

The flip-flop 17 has an input terminal D accepting the trigger signal 161. In response to the control signal 116, the flip-flop 17 generates an interrupt signal 117 to microprocessor 14. After the trigger signal 161 is enabled, as the control signal 116 to the CK input terminal of the flip-flop 17 is enabled, the interrupt signal 117 is thereby activated informing the microprocessor 14 to service this interruption. The instructions within the microprocessor 14 may cause the microprocessor to read the new count value 131 and recalculates an update frequency of the input signal 111 as required. If the interrupt signal 17 is not activated, the microprocessor 14 performs other tasks depending on the design of the instructions.

When the invention is employed in the video system and the input signal 111 is a horizontal synchronization signal, the reference signal 112 is preferably a high frequency oscillation signal with an order of Mega Hertz. If the input signal 111 is a vertical synchronization signal, the reference signal 112 is preferably the horizontal synchronization signal. Through the combination of the type of signals described, balance between the accuracy of frequency detection and time needed in determining the frequency of the input signal 111 is achieved.

It also has to be understood that there are many other choices in selecting the time points b1, c1 relative to the point a1. The ones shown in FIG. 2 depict just one preferred embodiment of the timing circuit 11 of the invention which is defined by the following claims.

What is claimed is:

1. An apparatus for detecting a frequency of an input signal, comprising:
   a timing control circuit, in response to said input signal and a reference signal of a predetermined frequency, generating first, second, third, fourth, and fifth control signals;
   a counter means having a clock input terminal for receiving said reference signal, the counter means, in response to said second control signal, resetting and beginning to count, the counter means having an output terminal for outputting a count value;
   a first latch having an input terminal for receiving said count value, the first latch, in response to said first control signal, latching said count value and outputting a new count value at an output terminal;
   a microprocessor means receiving said new count value and generating a value of the frequency of said input signal;
   a second latch having an input terminal coupled to the output terminal of said first latch, the second latch, in response to the third control signal, latching said new count value and outputting an old count value at an output terminal;
   a comparator having an output terminal and having a first and a second input terminal coupled to the output terminals of the first latch and the second latch, respectively, the comparator, in response to the fourth control signal, comparing said new count value and said old count value and outputting a trigger signal at its output terminal when the new and old count values are not equal; and
   a flip-flop having an input terminal for receiving said trigger signal, the flip,flop, in response to said trigger signal and the fifth control signal, generating an interrupt signal which causes said microprocessor means to recompute an updated frequency.

2. The apparatus as recited in claim 1, wherein the input signal is a video horizontal synchronization signal.

3. The apparatus as recited in claim 1, wherein the input signal is a video vertical synchronization signal.

4. The apparatus as recited in claim 3, wherein the reference signal is a video horizontal synchronization signal.

5. The apparatus as recited in claim 1, wherein the reference signal is a high frequency oscillation signal.

6. The apparatus recited in claim 1, wherein the third control signal is an inverted version of the first control signal.

7. The apparatus recited in claim 1, wherein the fourth control signal is an inverted version of the second control signal.

8. The apparatus recited in claim 1, wherein the fifth control signal is an inverted version of the second control signal.

9. The apparatus recited in claim 1, wherein the first control signal is asserted when a cycle of said input signal begins.

10. The apparatus recited in claim 1, wherein the second control signal is asserted when a cycle of said reference signal begins while the first control signal is negated.

11. The apparatus recited in claim 9, wherein the first control signal is negated when a second cycle of said reference signal counted from the assertion of the first control signal begins.

* * * * *